United States Patent [19]
Walles et al.

[11] Patent Number: 5,510,721
[45] Date of Patent: Apr. 23, 1996

[54] METHOD AND ADJUSTMENT FOR KNOWN GOOD DIE TESTING USING RESILIENT CONDUCTIVE STRAPS

[75] Inventors: Bethany J. Walles, Birmingham; Cuong V. Pham, Northville; Lawrence L. Kneisel, Novi; Brian J. Hayden, Royal Oak, all of Mich.

[73] Assignee: Ford Motor Company, Dearborn, Mich.

[21] Appl. No.: 358,297

[22] Filed: Dec. 19, 1994

[51] Int. Cl.⁶ .................................................. G01R 1/073
[52] U.S. Cl. ........................ 324/754; 324/765; 324/755
[58] Field of Search .................................. 324/72.5, 754, 324/765, 158.1, 73.1, 755; 439/482, 161; 437/8; 257/40, 48

[56] References Cited

U.S. PATENT DOCUMENTS

| | | | |
|---|---|---|---|
| 3,588,618 | 6/1971 | Otte | 29/626 |
| 3,670,409 | 6/1972 | Reimer | 174/68.5 |
| 4,099,991 | 7/1978 | Pops et al. | 148/11.5 C |
| 4,487,465 | 12/1984 | Cherian | 439/161 |
| 4,830,622 | 5/1989 | Erickson et al. | 439/70 |
| 4,950,173 | 8/1990 | Minemura et al. | 439/161 |
| 5,172,050 | 12/1992 | Swapp | 324/72.5 |
| 5,339,027 | 8/1994 | Woith et al. | 324/754 |

*Primary Examiner*—Vinh P. Nguyen
*Attorney, Agent, or Firm*—Kevin G. Mierzwa; Roger L. May

[57] ABSTRACT

A test apparatus for testing a know-good die integrated circuit is disclosed. The test apparatus uses conductive straps extending across trenches. The straps align with bond pads on the integrated circuit. When the bond pads are brought into contact with the straps, the straps exert a counterforce in the opposite direction to ensure a good electrical contact while testing the integrated circuit.

19 Claims, 2 Drawing Sheets

5,510,721

METHOD AND ADJUSTMENT FOR KNOWN GOOD DIE TESTING USING RESILIENT CONDUCTIVE STRAPS

BACKGROUND OF THE INVENTION

The present invention relates to a test socket for testing a bare integrated circuit. More specifically, the present invention is directed to a test socket for testing a known-good die using a shape memory alloy as the contacts.

Integrated circuit technology has progressed so that it is possible to mount a bare integrated circuit directly to a circuit board without enclosing it in a package having solder pins for mounting. One method of mounting a bare integrated circuit is called flip chip, which is commonly known in the art. In using the flip chip technique, the integrated circuit is tested before installation directly on the circuit board.

The testing of a known-good die is difficult because of the size of the package and the potential for varying heights in the bond pads. Making and maintaining a reliable electrical connection throughout the testing process is critical. Known test fixtures are also limited in durability.

One type of testing apparatus for a component having solder pins is described is U.S. Pat. No. 4,950,173. The apparatus uses a shape memory alloy having an opening for insertion of a component lead through the alloy. The component leads are gripped by the alloy and the circuit is then tested. The apparatus is also believed to be expensive since durability is believed to be limited to a relatively small number of testing cycles.

One problem with applying a component lead-gripping system to a known-good die which does not have solder pins is that the solder pads on a known good die are not very large. Consequently, there is little surface area for which to apply a gripping force to make a solid electrical contact.

It would therefore be desirable to provide a method and apparatus for reliably testing known-good dice which is also durable.

SUMMARY OF THE INVENTION

One object of the invention is to advantageously provide a method for testing a known-good die so that adequate electrical contact is maintained between the test socket and the component despite variations in the bond pad size and height.

The present invention includes a substrate having a plurality of trenches larger than the electrical contacts. A plurality of resilient conductive straps extends across the trenches. A securing means holds the substrate against the straps so that the straps are deformed in a predetermined manner into the trenches while the straps are urged against the contacts.

BRIEF DESCRIPTION OF THE DRAWINGS

FIG. 3 is four cross-sectional views (A–D) representing the phases of the straps of the test socket according to the present invention.

DETAILED DESCRIPTION OF THE PREFERRED EMBODIMENT

Figure 1:
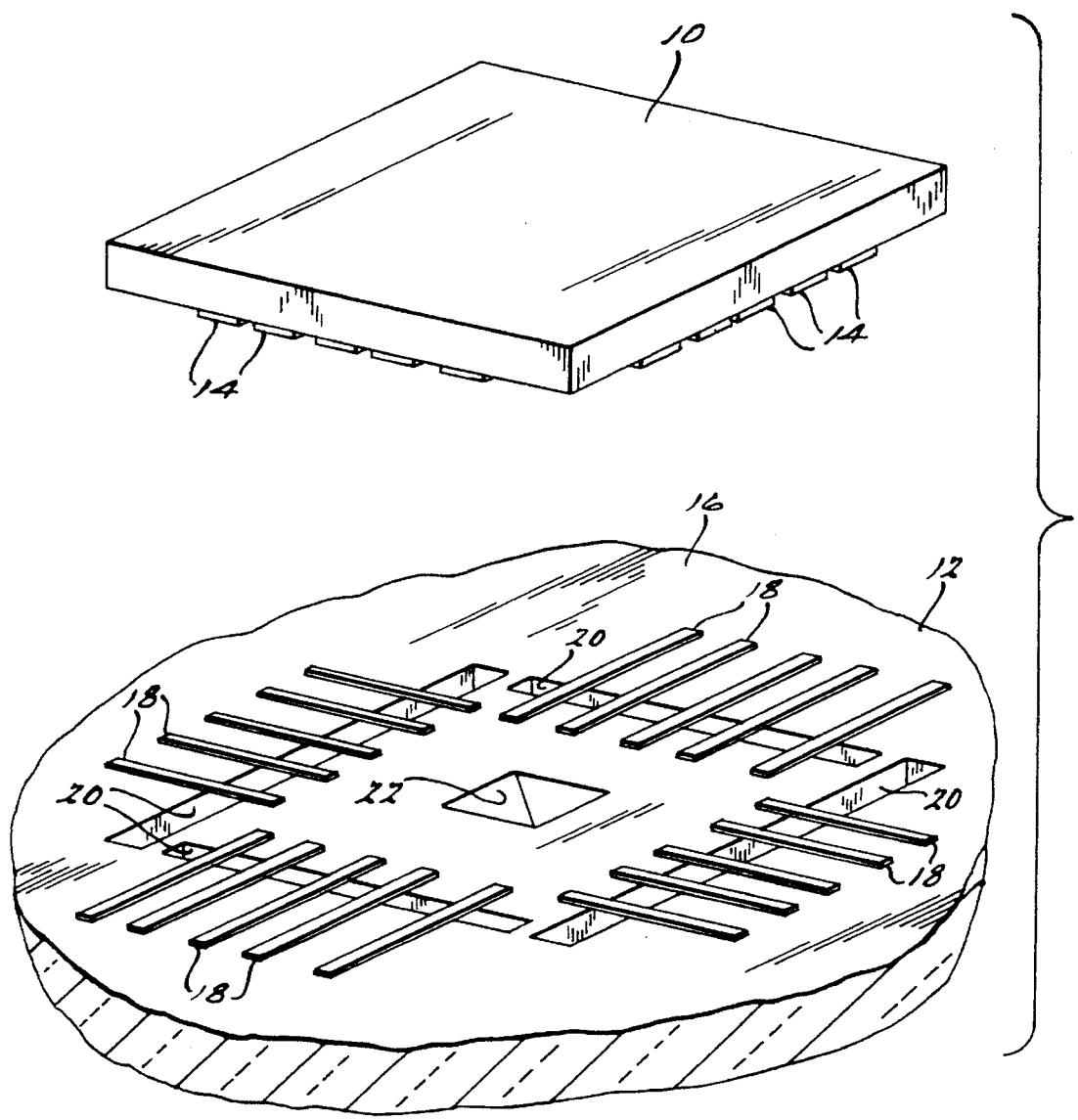
FIG. 1 is a perspective view of a known-good die with respect to a test socket according to the present invention.

Referring to FIG. 1., a bare integrated circuit 10 is placed onto a test socket 12 for testing. Integrated circuit 10 has a number of bond pads 14 around the perimeter of integrated circuit 10 for passing electrical signals to and from integrated circuit 10.

Test socket 12 is comprised of a substrate 16 having a number of conductive straps 18, trenches 20 under straps 18, and a vacuum hold down 22 for securing integrated circuit 10 to substrate 16.

Substrate 16 is preferably formed of a non-conductive material such as silicon or 7070 glass. The material should be durable and not deformable under the temperatures at which integrated circuit 10 is tested.

Substrate 16 has a series of trenches 20 which have a width and a length larger than bond pads 14. Trenches 20 align with bond pads 14. As shown in FIG. 1, one trench 20 is formed for each side of integrated circuit 10 having bond pads 14 so that when integrated circuit 10 and substrate 16 are placed together, bond pads 14 fit within trenches 20. Trenches 20 are formed in a conventional manner such as plasma etching or chemical etching. Trenches 20 preferably extend through substrate 16, but may also be formed to be deep enough to provide clearance for bond pad 14.

Conductive straps 18 formed of a commonly known shape memory alloys such as NiTi based alloy or copper-zinc-aluminum demonstrating the shape memory effect or the super-elastic effect. A shape memory alloy is a material which has the ability to "remember" a shape after deformation. Once these materials are shaped at low temperatures (the martensitic phase), they remain so formed until heated (the austenitic phase). After heating a shape memory alloy, it will return to its original predeformed shape. A super elastic material is one which remains highly flexible over a particular temperature range. Typically, one strap 18 is provided for every bond pad 14 since the operation of integrated circuit 10 is tested by checking the operation at every bond pad 14. Straps 18 have a length sufficient so as not deform permanently when bond pads 14 are placed against strap 18 into trench 20. So as not to permanently deform straps 18, the strain in the strap 18 should not exceed 3% of the length. The thickness of the strap is such that after thermal transformation as described further below, the strap places 1 gram of force on bond pad 14. The straps 18 are preferably coated with gold to prevent oxidation.

Vacuum hold down 22 is preferably a single hole in substrate 16 which provides a force for holding integrated circuit 10 to substrate 16. Other means may be used for applying force such as a rubber lid or grips.

Figure 2:
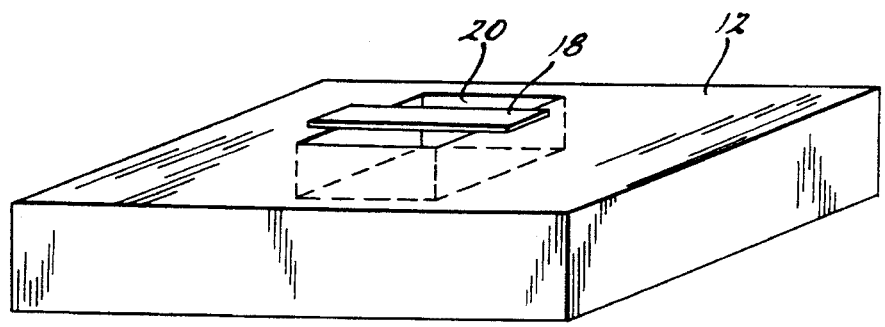
FIG. 2 is a perspective view of an alternative test socket according to the present invention.
Figure 2:
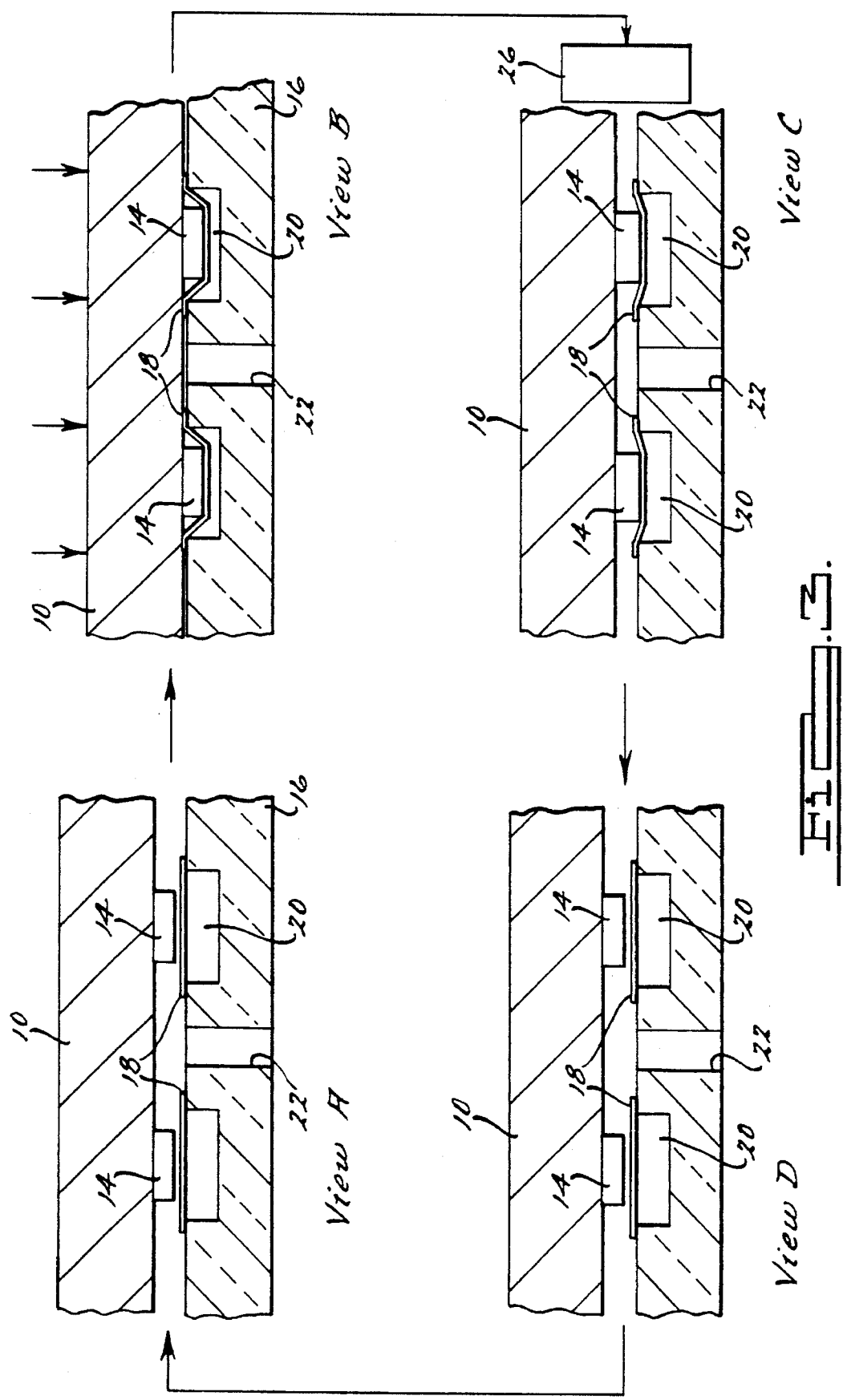

Referring now to FIG. 2, a portion of substrate 16 is shown. A single trench 20 is formed for each bond pad 14 as an, alternative to the configuration shown in FIG. 1. Although forming a trench for each bond pad 14 may be expensive, individual trenches 20 guide the bond pads into alignment with straps 18. If integrated circuit 10 is not aligned with trenches 20, bond pads 14 will not be within trenches 20.

Referring now to FIG. 3, View A, in operation, straps 18 are in the martensitic phase. Bond pads 14 are aligned with conductive straps 18.

In the next drawing (View B), bond pads 14 of integrated circuit 10 are inserted within trenches 20. Straps 18 deform around bond pads 14. Vacuum hold down 22 holds integrated circuit 10 against substrate 16.

In the next drawing (View C), the fixture is heated via heater 26. Straps 18 become austenitic which causes straps 18 to seek the planar state of View A. Straps 18 provide a counterforce to the downward force applied in View B. The counterforce ensures good electrical contact between conductive straps 18 and bond pad 14. One thing to note is that not all the solder pads may extend a uniform distance from integrated circuit 10 due to manufacturing variability. The austenite phase allows straps 18 to conform to bond pad variation. The temperature to which the system must be raised to enter the austenite phase varies depending on the composition of strap 18. For example, if the strap is 48% Ni and 52% Ti the austenite temperature is 125 C. which happens to be the same temperature that integrated circuits are burned in.

In the next drawing (View D), the fixture is brought to room temperature. Straps 18 return to their original shape in the martensitic state. The test fixture can be repeated many times.

If the composition of the shape memory alloy is changed or a super elastic material is used, heating the test fixture to get the straps in the austenite phase may not be required depending on the composition of the alloy.

As would be evident to one skilled in the art, several modifications of the invention may be made while still being within the scope of the appended claims. For example, the above description was directed to diced integrated circuits, however, the invention may be applied to the wafer level also by providing micromachined sockets mirroring the bond pads of each wafer on a single substrate.

What is claimed is:

1. An apparatus for a integrated circuit die having an electrical contact extending therefrom, comprising:

a substrate having a trench larger than said electrical contact;

a resilient conductive strap extending continuously across said trench corresponding to said electrical contact;

securing means for holding said integrated circuit die so that said contact is held against said strap in a first direction;

so that said strap is deformed in a predetermined manner into said trench while said strap is urged against said contact in a second direction opposite said first direction.

2. A test apparatus for an integrated circuit die as recited in claim 1 further comprising heating means for heating said substrate when said integrated circuit is secured against said strap.

3. A test apparatus for an integrated circuit die as recited in claim 1 wherein said securing means is comprised of a vacuum means.

4. A test apparatus for an integrated circuit die as recited in claim 3 wherein said vacuum means is comprised of an opening through said substrate.

5. A test apparatus for an integrated circuit die as recited in claim 1 further comprising a plurality of straps and a plurality of trenches wherein each contact has a corresponding trench.

6. A test apparatus for an integrated circuit die as recited in claim 1 wherein said resilient conductive strap comprises a shape memory alloy.

7. A test apparatus for an integrated circuit die as recited in claim 6 wherein said strap is formed of NiTi.

8. A test apparatus for a bare integrated circuit die as recited in claim 7 wherein said strap of NiTi is coated with gold.

9. A test apparatus for an integrated circuit die as recited in claim 1 wherein said electrical contact has a bottom surface, said strap urged against said bottom surface.

10. A test apparatus for an integrated circuit die as recited in claim 1 wherein said resilient conductive strap comprises a super elastic material.

11. A test apparatus for an integrated circuit die as recited in claim 1 wherein said substrate having an etched trench.

12. A test apparatus for an integrated circuit die as recited in claim 1 wherein said substrate is comprised silicon.

13. A method of testing an integrated circuit die having a plurality of contacts, each having a bottom surface extending therefrom comprising:

providing a substrate having a trench and a plurality of resilient conductive straps extending continuously across said trench;

aligning said contacts with said straps;

forcing said straps to deform by forcing said bottom surface of said contacts into said trench;

forcing said straps in a direction toward said contacts thereby ensuring electrical connection between said contacts and said straps;

passing electrical signals between said straps and said electrical contacts;

removing said electrical contacts from said straps; and reforming said straps substantially to a pretest shape.

14. A method of testing an integrated circuit die as recited in claim 13 wherein said step of forcing said strap in a direction out of said trench comprises heating said straps to a predetermined temperature.

15. A method of testing an integrated circuit die as recited in claim 13 wherein said step of reforming comprises cooling said straps.

16. A method of testing an integrated circuit die as recited in claim 13 further comprising the step of holding said integrated circuit die against said substrate.

17. A method of testing an integrated circuit die as recited in claim 16 wherein said step of holding comprises providing a vacuum for holding said integrated circuit die against said substrate.

18. A test apparatus for an integrated circuit die having a plurality of electrical contacts having a bottom surface extending therefrom, comprising:

a substrate having a plurality of trenches larger than said electrical contacts, each of said trenches having a width and a length;

a plurality of shape memory alloy straps extending continuously across said width of said trenches;

securing means for holding said die against said straps in a first direction; and heating means for heating said substrate to deflect said straps in a direction opposite said first direction so that said bare integrated circuit is secured against said bottom surface of said straps.

19. A test apparatus for an integrated circuit die as recited in claim 18 wherein each contact has a corresponding trench.

* * * * *